United States Patent
Lin et al.

(10) Patent No.: US 6,455,232 B1
(45) Date of Patent: *Sep. 24, 2002

(54) METHOD OF REDUCING STOP LAYER LOSS IN A PHOTORESIST STRIPPING PROCESS USING A FLUORINE SCAVENGER

(75) Inventors: Jason Lin, Kaohsiung (TW); Stefan Jenq, Taipei (TW); Eric Ou-Yang, Hsin-Chu (TW); Gilbert Tsai, Hsin-Chu (TW)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/059,850

(22) Filed: Apr. 14, 1998

(51) Int. Cl.[7] .............................. G03F 7/36; G03F 7/42; H01L 21/461; H01L 21/467; C23F 1/12
(52) U.S. Cl. ...................... 430/313; 430/329; 438/719; 438/723; 438/725; 438/740; 438/720; 438/906; 216/72; 216/49; 216/67
(58) Field of Search .................... 430/313, 329; 216/67, 72, 49; 438/719, 723, 725, 740, 720, 906

(56) References Cited

U.S. PATENT DOCUMENTS

| | | | |
|---|---|---|---|
| 4,582,581 A | | 4/1986 | Flanigan et al. ............... 216/67 |
| 4,822,450 A | | 4/1989 | Davis et al. ................. 438/709 |
| 5,286,344 A | | 2/1994 | Blalock et al. ............. 438/723 |
| 5,302,236 A | | 4/1994 | Tahara et al. ................. 216/67 |
| 5,423,945 A | | 6/1995 | Marks et al. ............... 438/695 |
| 5,505,816 A | * | 4/1996 | Barnes et al. ............ 156/662.1 |
| 5,770,100 A | * | 6/1998 | Fukuyama et al. ........... 216/69 |
| 5,824,604 A | * | 10/1998 | Bar-Gadda .................. 438/725 |
| 5,888,309 A | * | 3/1999 | Yu .............................. 134/1.2 |
| 5,930,668 A | * | 7/1999 | Gardner ...................... 438/624 |
| 6,136,685 A | * | 10/2000 | Narwankar et al. ......... 438/624 |
| 6,143,666 A | * | 11/2000 | Lin et al. .................... 438/725 |
| 6,177,337 B1 | * | 1/2001 | Naeem ....................... 438/618 |

* cited by examiner

*Primary Examiner*—John S. Chu
*Assistant Examiner*—Sin J. Lee
(74) *Attorney, Agent, or Firm*—Stallman and Pollock; Joseph Bach

(57) ABSTRACT

A method of stripping a photoresist layer in a plasma derived from an etch gas for the photoresist and a fluorine-containing polymer includes a scavenging gas for fluorine in the resist strip etch plasma. The scavenger for flourine reduces the amount of fluorine released from a fluorine-containing polymer into the resist etch plasma during polymer dissociation in the photoresist stripping step, thereby providing a photoresist stripping mechanism with reduced stop layer loss.

18 Claims, 3 Drawing Sheets

METHOD OF REDUCING STOP LAYER LOSS IN A PHOTORESIST STRIPPING PROCESS USING A FLUORINE SCAVENGER

BACKGROUND OF THE INVENTION

1. Field of the Invention

The present invention relates to etch techniques used in integrated circuit manufacturing and, in particular, to a method of reducing stop layer loss in photoresist stripping subsequent to oxide etching by introducing a scavenger for fluorine, such as carbon monoxide, into the resist strip etch chemistry.

2. Description of the Related Art

The direction of semiconductor integrated circuit manufacturing technology is toward continuously improving the density of integrated circuit devices. One of the important goals in achieving increased device density is raising the selectivity of the etch step used to strip a photoresist mask following use of the mask in a patterning step.

More specifically, after a photoresist layer has been formed and defined on an underlying layer to be etched, such as an oxide layer, patterning of the oxide layer generally includes two process steps. First, referring to FIG. 1, the oxide, using overlying defined and developed photoresist (PR), is subjected to oxide etching 100. Second, a photoresist stripping step 200 is performed to remove the photoresist to finish the patterning process.

In some cases, as with the Applied Materials HDP 5300 etcher, the two steps are performed sequentially in the same process chamber without transferring the wafer between chambers. In other cases, as shown in FIG. 2, a transition process 150 may be employed between the two steps to change and stabilize gas conditions in the chamber.

The manufacture of semiconductor integrated circuit devices often includes the formation of oxide layers for purposes of insulation and device formation. Accuracy in defining the pattern of the oxide layer is a vital factor in the design of the integrated circuit.

Numerous developments in etching the oxide layer with high selectivity to an underlying stop layer have been made. One widely utilized technology for oxide etching is the use of a fluorinated chemical etchant. During the oxide etch step, a fluorine-containing polymer is formed as a passivation material and functions as an etch stop to cover the underlying stop layer, such as silicon nitride or polysilicon, to increase the oxide etch selectivity dramatically.

For example, U.S. Pat. No. 5,286,344 to Blalock, et al. discloses a fluorinated chemical etchant system for etching an oxide layer on an underlying silicon nitride stop layer. The chemical etchant system disclosed by Blalock, et al. includes a fluorocarbon etchant material and an additive material such as $CH_2F_2$. The selectivity of the oxide etching is increased by the formation of polymer on the underlying nitride surface.

U.S. Pat. No. 5,423,945 to Marks, et al. discloses a method of etching an oxide over a nitride with high selectivity. In the Marks, et al. process, the oxide is plasma etched with a carbon and a fluorine-containing etch gas in the presence of a flourine scavenger, therby forming a carbon rich polymer which passivates the nitride. This polymer is inert to the plasma etch gases and, thus, provides high selectivity to the etch process.

FIG. 3 shows an example of a self-aligned contact (SAC) process in which an oxide 10 is etched using a patterning photoresist 12. As discussed above, due to the nature of the oxide etch chemistry, a fluorine-containing polymer 14 forms as an etch stop that passivates the silicon substrate 16 and a nitride spacer 18 from etching. Following oxide etching, the pattern-defining photoresist 12 and the fluorine-containing polymer 14 are then removed. During plasma stripping of the photoresist 12 and the fluorine-containing polymer 14, fluorine is released into the plasma from the dissociation of the polymer. The photoresist stripping plasma, now including free fluorine released from the polymer, etches the unprotected stop layer to the detriment of the device structure. More specifically, referring to FIG. 4, the stop layers, i.e., the substrate 16 and the nitride spacer 18, are etched by the fluorine-containing plasma during the removal of the polymer in the photoresist stripping step.

Thus, as the density of integrated circuits becomes greater, the tolerance for stop layer loss becomes smaller and the problem becomes more serious. Losing several hundred Angstroms in a stop layer, which could have been neglected in the past, has now become a crucial limit in integration circuit density. For densely packed devices like memory cells, it is difficult to compensate for stop layer loss by increasing deposition within the narrow spaces of the memory cell array and, thus, the loss of the stop layer damages the function of the device.

In general, a conventional oxide etching process involves the utilization of a fluorocarbon etch gas, such as $CF_4$, $C_2F_6$, $C_3F_8$, $CH_2F_4$ and the $C_xF_y$ group. The rich amount of free fluorine atoms and fluorine-containing radicals in plasmas resulting from these compounds forms the fluorine-rich passivation polymer described above. The polymer typically contains about thirty percent by weight of carbon and about sixty percent by weight of fluorine. Even with technologies that form a polymer that contains lower amounts of fluorine or a carbon-rich polymer, the polymer still contains about forty percent by weight of fluorine.

SUMMARY OF THE INVENTION

The present invention provides a method of reducing stop layer loss in a photoresist stripping plasma etch step by utilizing a scavenger for fluorine in the photoresist strip etch chemistry. In accordance with the invention, the scavenger reacts with the free fluorine generated by the dissociation of fluorine-containing polymer during the resist strip step and reduces the content of free fluorine in the plasma. By reducing the amount of fluorine available to attack the stop layer, the loss of the stop layer can be greatly reduced.

The method includes the steps of providing a substrate with a fluorine-containing polymer, a photoresist layer, a patterned layer, and at least one stop layer formed thereon. The fluorine-containing polymer is formed on the stop layer during an etching process and serves as an etch stop for achieving high selectivity. Following the etching process, the photoresist layer is stripped in a plasma derived from an oxygen-containing gas and a fluorine scavenger, with some content of free fluorine. The content of free fluorine is released from the fluorine-containing polymer during photoresist stripping. The fluorine scavenger reduces the concentration of free fluorine in the resist strip plasma.

The foregoing aspects of the present invention will become more readily appreciated and better understood by reference to the following detailed description which should be considered in conjunction with the accompanying drawings.

DETAILED DESCRIPTION OF THE INVENTION

In accordance with the present invention, a scavenger for fluorine is used in a photoresist stripping etch process. The addition of the scavenger binds free fluorine atoms in the plasma and reduces the loss of a stop layer, such as a silicon substrate, a polysilicon layer or a silicon nitride layer, during the resist strip. Minimizing stop layer loss helps increase device density in integrated circuit structures.

Those skilled in the art will appreciate that a wide variety of patterning layers, stop layers, photoresists and photoresist stripping processes can be alternatively employed, with the addition of a fluorine scavenger gas, all in accordance with the concepts of the present invention.

As discussed above, a photoresist stripping process must be performed after an oxide etching process to strip the photoresist mask and to remove the fluorine-containing polymer formed on the stop layer during the oxide etch process. The polymer dissociates under the attack of a plasma derived from oxygen-containing gases. The dissociation of the polymer generates free fluorine in the plasma. The continuous formation of free fluorine accompanying the plasma bombardment attacks the stop layer. Thus, undesired stop layer loss can be observed after the photoresist stripping. This stop layer loss within densely packed circuits causes current leakage across thin layers and can damage the device.

In accordance with the present invention, the free fluorine atoms and fluorine-containing radicals in the resist stripping plasma can be minimized to reduce the loss of the stop layer. The rate of attack of the stop layer and, thus, of stop layer removal, can be reduced with the addition of a scavenger for fluorine.

Figure 1:
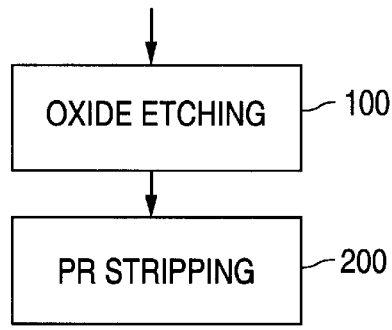
FIG. 1 is a flowchart illustrating a patterning process in accordance with a prior art method.
Figure 2:
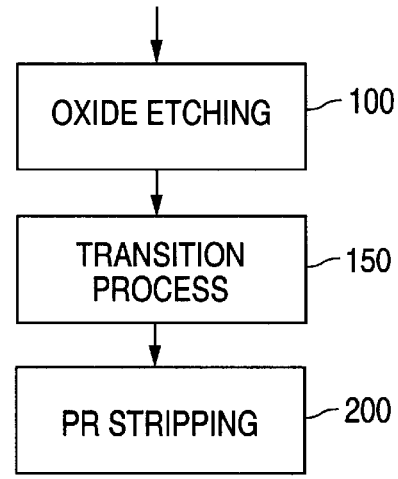
FIG. 2 is a flowchart illustrating a patterning process with a transition process in accordance with a prior art method.
Figure 3:
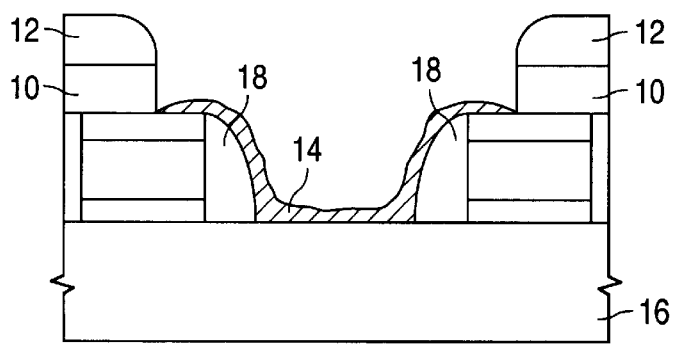
FIG. 3 is a partial cross-sectional drawing illustrating a substrate with fluorine-containing polymer as an etch passivation in accordance with the prior art.
Figure 4:
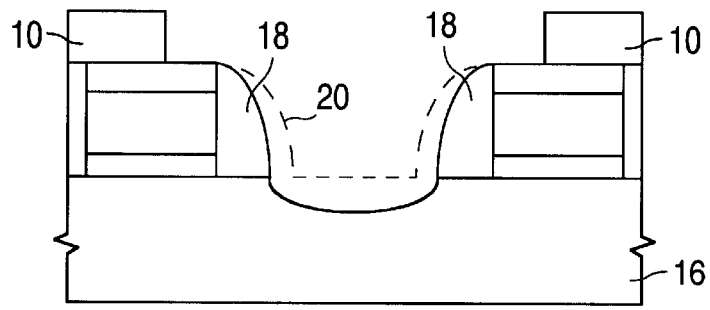
FIG. 4 is a partial cross-sectional drawing illustrating stop layer loss of the silicon substrate and the silicon nitride spacer during photoresist stripping in accordance with a prior art method.
Figure 5:
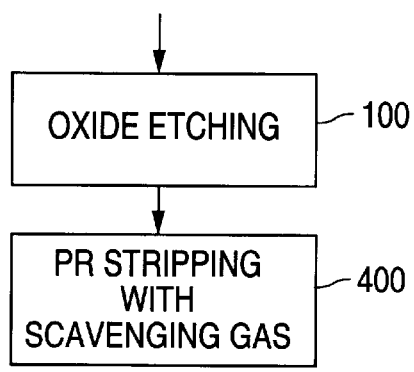
FIG. 5 is a flow chart illustrating a patterning process in accordance with the method of the present invention.

In accordance with the present invention, as shown in FIG. 5, the photoresist stripping step 400 with a scavenging gas is performed after the oxide etching step 100. The photoresist stripping step 400 is generally performed with a gaseous reactive oxygen species provided by a plasma derived from an oxygen-containing process etching gas. Atomic oxygen may be generated as a plasma species under electric field or magnetic field at low pressure. The scavenging gas for fluorine can be introduced simultaneously with the oxygen-containing gas.

A gas containing both carbon and oxygen elements can be employed as the scavenging gas. A preferred source of the scavenging gas is carbon monoxide (CO). Carbon monoxide is supplied with the oxygen as the reaction gas in the preferred embodiment. The presence of carbon monoxide reduces the concentration of free fluorine in the plasma through multiple chemical reactions. Stop layer loss due to bombardment with the fluorine-containing plasma is thereby reduced.

The chemical reactions of carbon monoxide for scavenging fluorine have been investigated in detail. For example, Hisataki and Mokoto, "Mechanism of highly selective $SiO_2$ to $Si_3N_4$ etching using $C_4F_8$ plus CO plasma", Dry Process Symposium, Tokyo, 1996, found that carbon monoxide supplies carbon by dissociation and scavenges the fluorine by forming $COF_x$. The carbon to fluorine ratio in the plasma is increased and leads to the increase of $SiO_2$ to $Si_3N_4$ selectivity. The selectivity increases with a large amount of carbon monoxide addition.

Similarly, in U.S. Pat. No. 5,302,236, Tahara, et al. disclose a method of etching an oxide over nitride. In the Tahara, et al. method, gas containing both carbon in an oxidation state less than four and oxygen, e.g. carbon monoxide, is present in the plasma atmosphere of the processing vessel. Free radicals generated by decomposing a gas containing a halogen element are thereby reduced. The deposition of a flourine-containing polymer film is suppressed, a carbon film is formed and the etch selectivity for oxide is increased.

The photoresist strip step 400 of a preferred embodiment of the present invention is carried out in a vacuum chamber with a controlled pumping system. The throttle valve controlling the suction of the pumping system is adjusted for pressures ranging from about 10 millitorr to about 70 millitorr. However, the pressure can vary in a greater range with different chamber designs, etching gases and scavenging gas supplements. An RF etch chamber which independently controls a plasma source power and a bias power can be used. In general, the source power primarily controls the deionization rate of the reaction gas and the bias power varies the bombardment energy of the ions. The source power, which is a vital factor in controlling the scavenging of the fluorine and the removing rate of the photoresist and the polymer, can be varied from about 1000 to about 3000 watts. A high source power increases the removing rate, but decreases the scavenging of the fluorine and, thus, increases the stop layer loss. The bias power is set at about 100 watts to about 400 watts. The frequency of RF power, which depends upon the process and the chamber design, is about 2.0 megahertz for the source power and 1.8 megahertz for the bias power. The etch gas is oxygen supplied at a flow rate of about 100 SCCM to about 500 SCCM. Other oxygen-containing gases can be used and the flow rate adjusted appropriately. A carbon monoxide scavenging gas with a flow rate of about 50 SCCM to about 300 SCCM is utilized in the preferred embodiment. Utilizing the above-stated parameters, the loss of a silicon substrate as a stop layer in a photoresist stripping step 400, after patterning an upper oxide layer, can be reduced to half or even less, in accordance with the method of the present invention.

Figure 6:
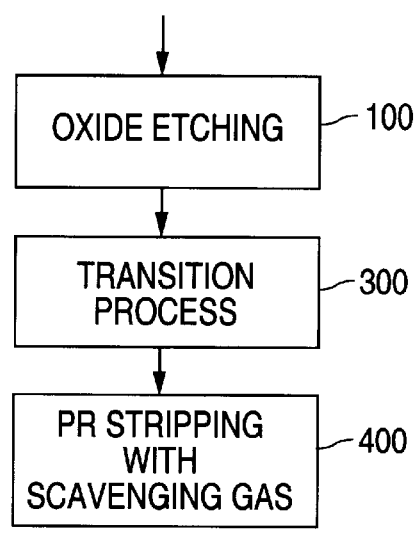
FIG. 6 is a flowchart illustrating a patterning process with a transition process in accordance with the method of the present invention.

For an in-situ chamber design such as the Applied Materials HDP 5300 chamber, where the oxide etching step 100 and the photoresist stripping step 400 are performed in the same chamber, a transition process step 300 can be added to change and stabilize the chamber gas conditions, as shown in the FIG. 6 flowchart. A transition process step 300 employed in this embodiment of the invention is performed by supplying oxygen at about 100 SCCM to 500 SCCM with a chamber pressure in the range of about 10 millitorr to 70 millitorr for about 3 seconds to 20 seconds. The influence of the transition process step 300 is helpful in optimizing the stop layer loss. The step can be optional and the gas condition and the parameters can be varied. Since the oxide etching step 100 and the photoresist stripping step 400 are performed in the same chamber, fluorine-containing polymer is formed on the chamber wall in the etching process. With conventional photoresist stripping techniques, the polymer on the chamber wall releases more fluorine in the stripping process and, thus, enhances stop layer loss. Since, in accordance with the method of the present invention, fluorine from both the wafer and the chamber wall is scavenged, stop layer loss is reduced during photoresist stripping.

Figure 7:
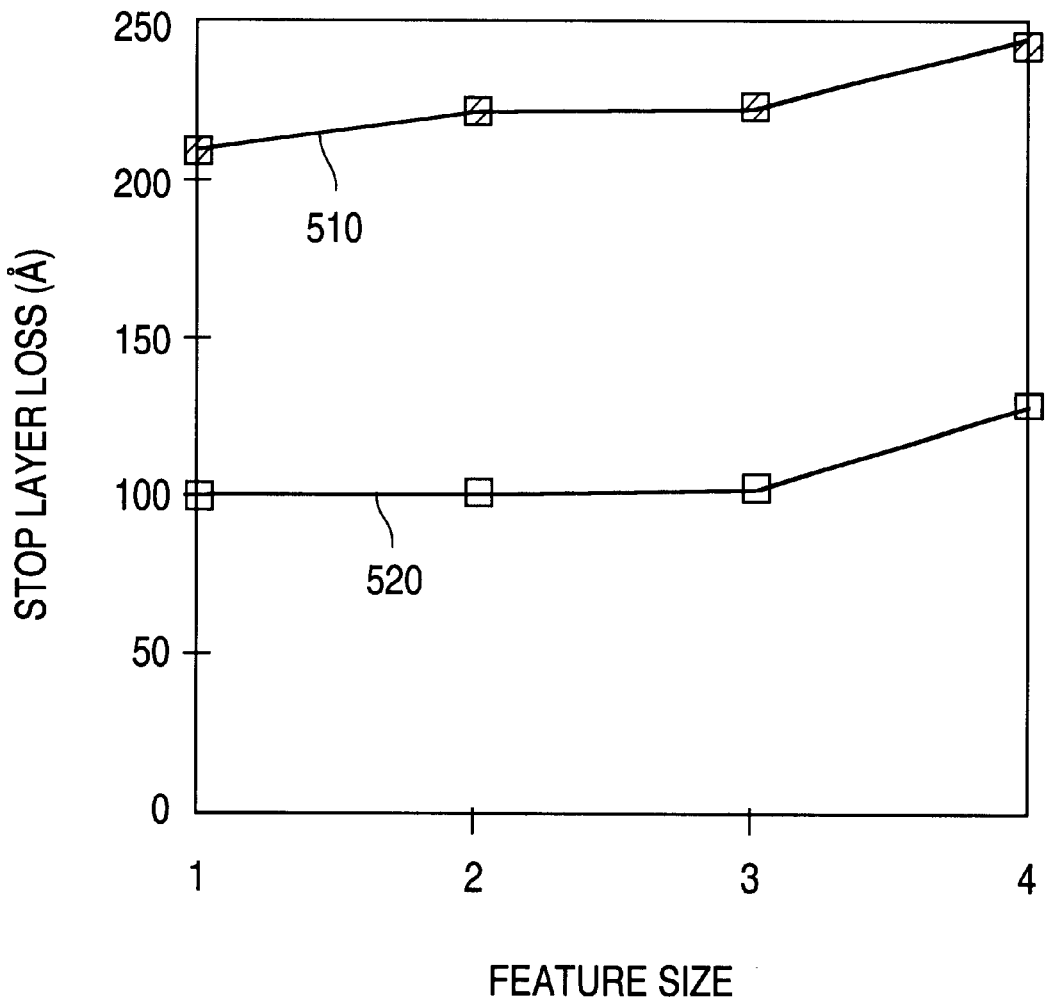
FIG. 7 is a graph showing experimental results with various feature sizes comparing prior art methods with a method in accordance with the present invention.

FIG. 7 shows experimental results utilizing various feature sizes in integrated circuit structures. Stop layer loss with the conventional method, shown in line 510 in FIG. 7, was about 200 Angstroms above the polysilicon layer, which depends on the feature size and location. As shown in line 520 in FIG. 7, the silicon substrate loss can be reduced to about 100 Angstroms utilizing the present invention.

As will be understood by those skilled in the art, the foregoing description of the present invention is an illustration of the invention rather than a limitation thereon. It is intended that various modifications and similar arrangements be included within the spirit and scope of the invention.

What is claimed is:

1. A method of reducing stop layer loss in a photoresist stripping process performed in a reactor chamber, wherein a photoresist mask is formed on a silicon oxide layer and the silicon oxide layer is formed on an underlying stop layer, the method comprising:

patterning the silicon oxide layer using a fluorine-containing etchant such that a fluorine-containing polymer is formed over said stop layer in regions where said silicon oxide layer has been etched;

following the patterning step, introducing an etch gas for said photoresist mask and said fluorine-containing polymer and a scavenging gas for fluorine into the reactor chamber, wherein said scavenging gas is introduced into the reactor chamber, from a scavenging gas source external to the reactor chamber; and stripping said photoresist mask and said fluorine-containing polymer in a plasma derived from said etch gas and from said scavenging gas for fluorine to remove said photoresist mask and said fluorine-containing polymer, a content of free fluorine being released from said fluorine-containing polymer when being removed, said scavenging gas for fluorine reducing the concentration of said content of free fluorine in said plasma.

2. The method of claim 1, and wherein said stop layer comprises a silicon substrate.

3. The method of claim 1 and, wherein said stop layer comprises a silicon nitride layer.

4. The method of claim 1, and wherein said stop layer comprises a polysilicon layer.

5. The method of claim 1, and wherein said photoresist stripping is carried out in a vacuum chamber with pressures ranging from about 10 millitorr to about 70 millitorr.

6. The method of claim 1, and wherein said photoresist stripping is carried out in a plasma chamber with a source power in the range of about 1,000 watts to about 3,000 watts and a bias power at about 100 watts to 400 watts.

7. The method of claim 1, and wherein said etch gas comprises an oxygen-containing gas.

8. The method of claim 1, and wherein said oxygen-containing gas comprises oxygen.

9. The method of claim 1, and wherein said scavenging gas for flourine comprises a carbon- and oxygen-containing gas.

10. The method of claim 9, and wherein said carbon- and oxygen-containing gas comprises carbon monoxide (CO).

11. A method of reducing stop layer loss in a photoresist stripping process performed in a reactor chamber, the method comprising:

providing in the reactor chamber a semiconductor substrate having at least one stop layer formed on the substrate, a silicon oxide layer formed over said stop layer to define exposed regions of the stop layer, a fluorine-containing polymer formed on said exposed regions of the stop layer, and a photoresist layer formed on said silicon oxide layer;

introducing an etch gas for said photoresist layer and said fluorine-containing polymer and a scavenging gas for fluorine into the reactor chamber, the scavenging gas for fluorine being introduced into the reactor chamber from a source external to the reactor chamber; and stripping said photoresist layer and said fluorine-containing polymer in a plasma derived from said etch gas and from said scavenging gas for fluorine to remove said photoresist layer and said fluorine-containing polymer, said etch gas being derived from an oxygen-containing gas, said scavenging gas being derived from a carbon- and oxygen-containing gas, fluorine being released from said fluorine-containing polymer during said stripping step, said scavenging gas for fluorine reducing the concentration of fluorine in said plasma.

12. The method of claim 11, and wherein said stop layer comprises a silicon substrate.

13. The method of claim 11, and wherein said stop layer comprises a silicon nitride layer.

14. The method of claim 11, and wherein said stop layer comprises a polysilicon layer.

15. The method of claim 11, and wherein said photoresist stripping is carried out in a vacuum chamber with pressures ranging from about 10 millitorr to about 70 millitorr.

16. The method of claim 11, and wherein said photoresist stripping is carried out in a plasma chamber with a source power in the range of about 1,000 watts to about 3,000 watts and a bias power at about 100 watts to 400 watts.

17. The method of claim 11, and wherein said oxygen-containing gas comprises oxygen.

18. The method of claim 11, and wherein said carbon- and oxygen-containing gas comprises carbon monoxide (CO).

* * * * *